United States Patent [19]

Christoffel

[11] Patent Number: 5,431,072
[45] Date of Patent: Jul. 11, 1995

[54] CARBIDE CUTTING TIP COATING WITH HARD MATERIAL AND METHOD OF PRODUCING IT

[76] Inventor: Klaus Christoffel, Kreuzbuhlstrasse 50, 7470 Albstad 1, Germany

[21] Appl. No.: 390,239

[22] Filed: Aug. 4, 1989

[30] Foreign Application Priority Data

Sep. 8, 1988 [DE] Germany ................. 38 30 525.9

[51] Int. Cl.$^6$ .................... B23B 27/16; B23C 5/20
[52] U.S. Cl. ...................................... 76/115; 407/119; 408/144
[58] Field of Search ............... 76/101.1, 108.1, 108.2, 76/108.4, 108.6, 115, DIG. 11, DIG. 12; 228/122, 185; 407/119; 408/1 R, 144, 145; 409/131, 132

[56] References Cited

U.S. PATENT DOCUMENTS

| | | | |
|---|---|---|---|
| 3,078,546 | 2/1963 | Kiernan | 76/115 X |
| 3,882,579 | 5/1975 | Peacock | 76/115 X |
| 4,353,669 | 10/1982 | Striegl | 408/185 |
| 4,396,077 | 8/1983 | Radtke | 76/108.2 |
| 4,643,620 | 2/1987 | Fujii et al. | 407/119 |

FOREIGN PATENT DOCUMENTS

| | | | |
|---|---|---|---|
| 0089818 | 9/1983 | European Pat. Off. | 407/119 |
| 3020929 | 11/1983 | Germany | |
| 3527948 | 2/1987 | Germany | 76/108.2 |

OTHER PUBLICATIONS

"Mill With Coated Inserts? Sure!" Modern Machine Shop, Oct. 1987 pp. 52–59.
"PVD coatings for protecting tools against wear" by Balzers translated from VDI Journal, Sep. 1985 pp. 691–696.
"Sintered metal-coated cutting tools of high-speed steel" translated from Industrie anzeiger Dec. 1980 pp. 24–28.

Primary Examiner—Z. R. Bilinsky

[57] ABSTRACT

The tool face 12 and the flank 13 as well as the cutting edge 14 of a carbide cutting tip 19 for the fine machining of bores or the like are coated with a thin hard-material coating 21, 22 of TiC or TiCN by the PVD method and this coating is not partly ground off again subsequently, as practiced in cutting tips coated by the CVD method to restore a shaper cutting edge. As a result of the fully retained coating, inter alia both the flank wear is reduced and the chip flow over the toll face is improved, which produces an excellent surface quality of a bore. The cutting tip is especially suitable for single-blade reamers.

23 Claims, 4 Drawing Sheets

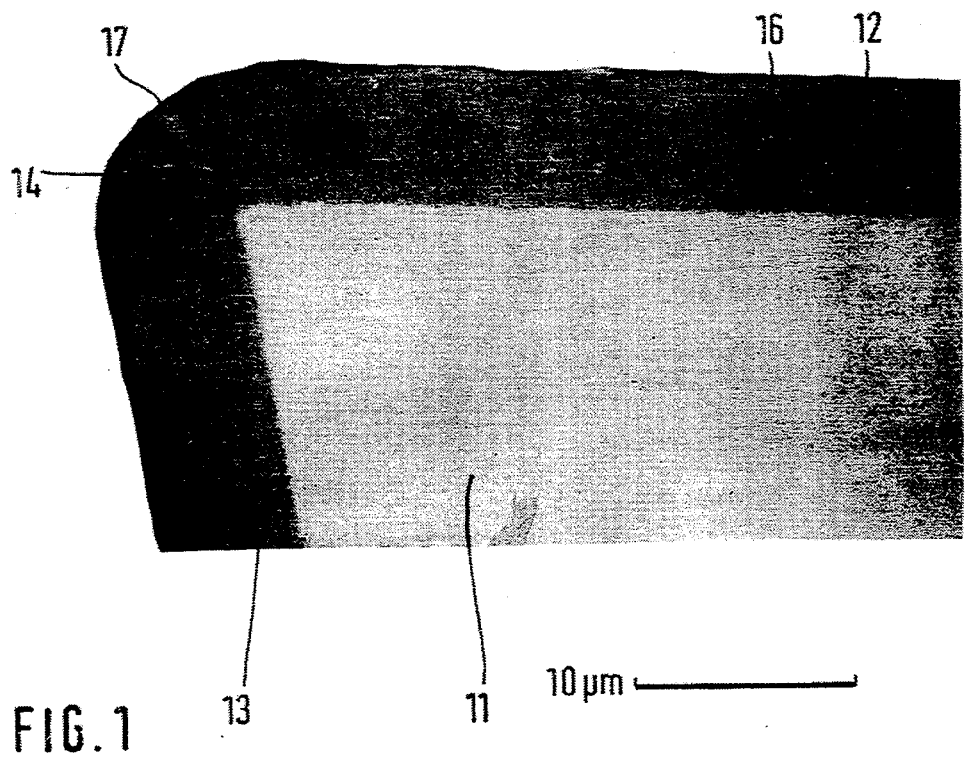
FIG.1 PRIOR ART
FIG.2
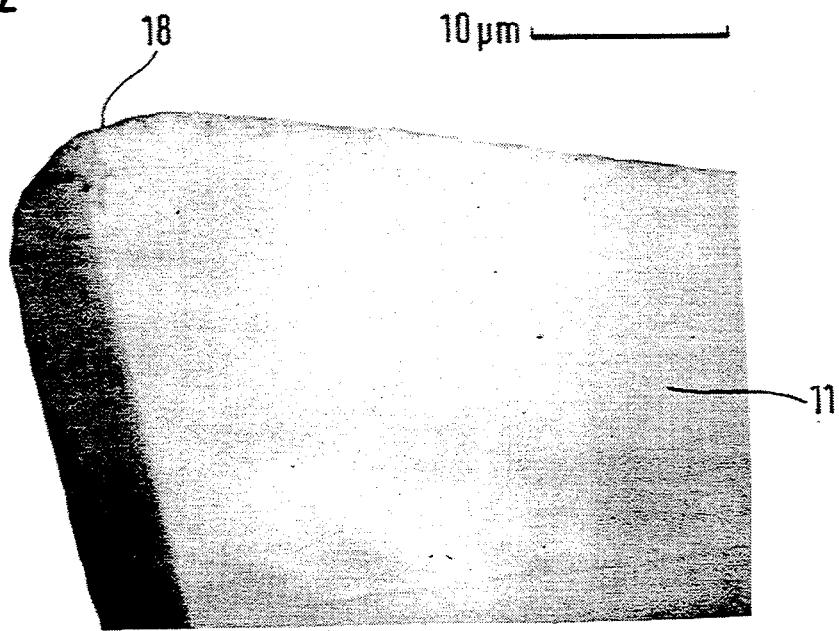
PRIOR ART

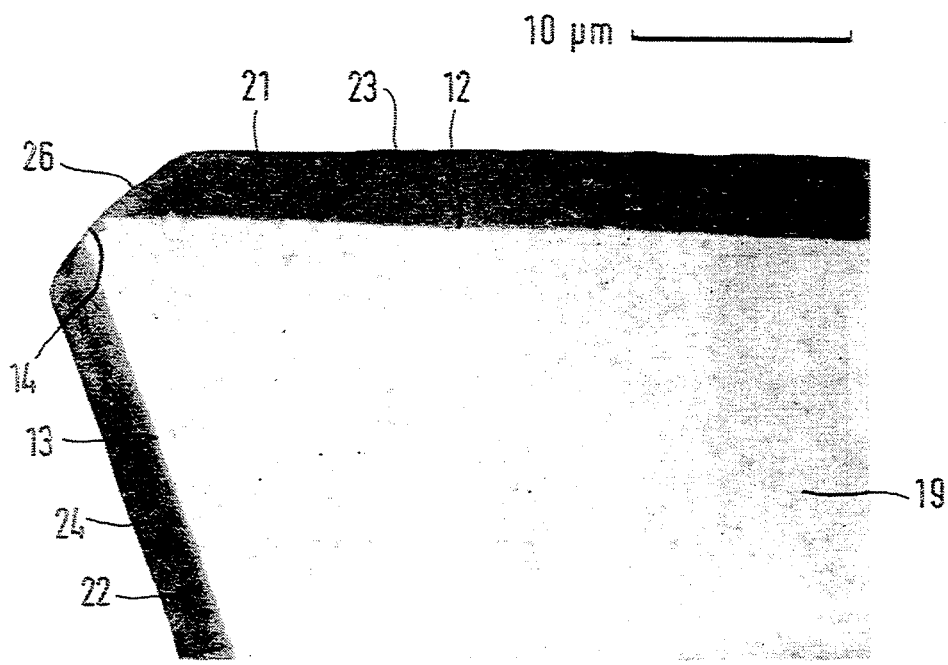
FIG. 3
FIG. 4
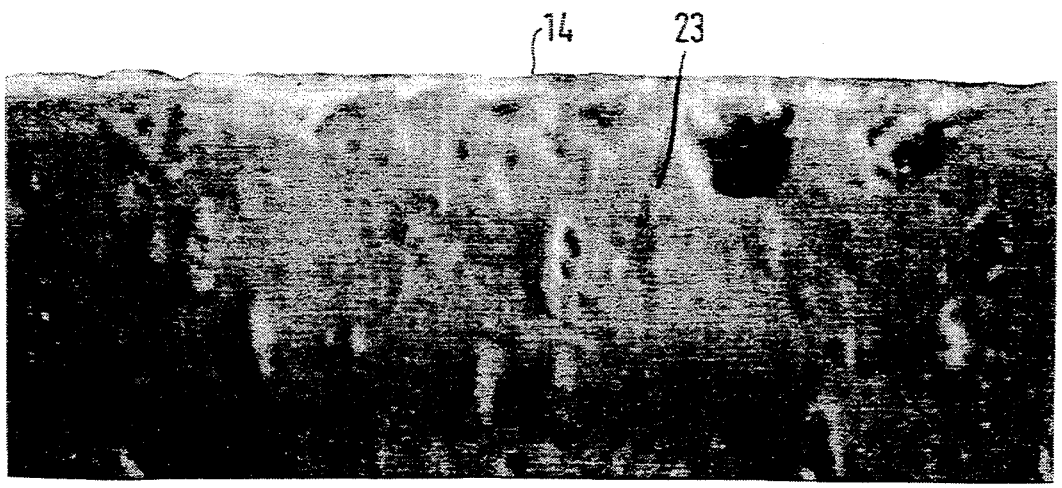

CARBIDE CUTTING TIP COATING WITH HARD MATERIAL AND METHOD OF PRODUCING IT

The invention relates to a carbide cutting tip and also a method of producing it.

BACKGROUND OF THE INVENTION AND RELEVANT PRIOR ART

Carbide cutting tips in the field of the invention have a flank, a tool face, a cutting edge provided at the transition between the flank and the tool face, and a thin hard material coating that contains titanium and nitrogen and is deposited on the flank, the tool face and in the area of the cutting edge.

Such a carbide cutting tip is described, for example, in German Patent Specification 3,020,929. According to this reference, however, the applied hard-material coating must be removed—for example by grinding—so that the cutting edge radius necessary for fine machining is obtained. This is because the cutting edges are rounded too much by the CVD method (chemical vapor deposition) practiced up to now. In the coating of carbides, the CVD method has probably not been dispensed with hitherto because it was believed that this method produced the best coating adherence. Carbide can endure the relatively high coating temperatures of about 1000 degrees C. without hardness loss. But a disadvantage here is the roundness of the cutting edge.

OBJECTS AND STATEMENT OF THE INVENTION

An object of the invention is to provide carbide cutting tips, in particular for fine machining of bores, which—without having to subsequently remove the hard material nonetheless lead to very small cutting-edge radii and are more stable than the carbide cutting tips produced previously with their hard-material coating partly removed.

A related object of the inventions is to provide a process for manufacturing such cutting tips.

According to the invention, the first object is achieved by the following features:
 a) the hard material coating is a coating deposited by the PVD (Physical Vapor Deposition) method, and
 b) the hard material coating is not subsequently removed.

The process for manufacturing cutting tips according to the invention includes the following steps:
 a) treating the cutting tip in a PVD installation, and
 b) applying for the same period of time a hard material coating of TiCN to the tool face of the cutting tip and a hard material coating to its flank.

The invention also includes the following additional advantageous features:

The carbide has a K-quality according to ISO classification, wherein the carbide has a quality within the range K05 to K20, and preferably a K10 quality. The flank and/or the tool face has a surface quality of Rz smaller than 0.5, preferably no greater than 0.3 or 0.1. The ISO classification denotes in this case an International Standard Organization standard for carbide.

K-quality refers to the group of physical characteristics, including composition, hardness and other characteristics indicated by the group of carbides designated K05 to K20 in accordance with the ISO standard.

Rz denotes an arithmatic average value of five measurements of surface roughness or waviness according to West German standard DIN 4768.

The cutting tip is designed for fine machining of bores, or a single blade reamer. The cutting tip is a reversible tip. The surface of the cutting tip is chemically cleaned several times and is not cleaned by ultrasonics.

The hard-material coating on the tool face is thinner than on the flank. The hard-material coating on the flank is less than 4 $\mu$m thick, preferably less than 3 $\mu$m thick, and from 2.5 to 1.5 $\mu$m. The hard material coating on the tool face is less than 4 $\mu$m thick, preferably less than 3 $\mu$m thick, and from 1.5 to 2.5 $\mu$m. At the transition from the flank to the tool face in the area of the cutting edge, the coating thickness of the hard-material coating is considerably reduced compared with the adjoining coating thickness on the flank and the tool face.

The surface of the hard material coating at the transition is roughly in the configuration of a bevel. The bevel is roughly perpendicular to the angle bisector of the flank and the tool face.

The process according to the invention includes the following additional advantageous step: treating the cutting tip for a duration to provide a coating thickness of less than 4 $\mu$m.

Tests have shown that the details given in U.S. Pat. No. 3,020,929 and brochures from the patentee are not correct, for the cutting area is rounded again by the grinding-off of the hard-material coating, and in fact cutting-edge radii of 20 $\mu$m are obtained. The rounding after the removal of the hard material is thus just as great as the rounding caused by coating, with the disadvantage that the tool face "freed" of hard material has less endurance, produces a poorer chip flow, requires higher cutting forces and has a high tendency to form built-up cutting edges.

The invention brings about the following distinct improvements:
 1. Tests have revealed a statistically 100% greater endurance.
 2. The chip flow is better.
 3. The tendency to form built-up cutting edges is less.
 4. The cutting forces are smaller.
 5. The surface roughness is smaller.
 6. The cutting edge, despite coating, is substantially sharper than the one which was "freed" of hard material.
 7. In the PVD method, the coating thickness of, for example, 1.5 to 2 $\mu$m can be accurately maintained, which is not possible in the CVD method.
 8. In the PVD method, not only can thinner coatings be produced but very close coating-thickness tolerances can be maintained. This is good in the sense that a chain is never stronger than its weakest link.
 9. When it has been stated above that carbides do not show any changes in the CVD coating method at temperatures of about 1,000° C., this is only partly correct: a brittle phase (called "eta phase" in technical terminology) still forms even if the size of this phase has recently no longer been so extreme as at the start of the introduction of the CVD method. The brittle phase still present can lead to stability problems especially in the area of sharp edges. The invention avoids this phase on account of the lower process temperatures of less than 500° C. in the PVD method.

10. The PVD coating has a smaller internal stress than the CVD coating. The lower process temperature is probably responsible for this, which is why differences in the coefficients of expansion from the parent material to the coating material do not have too great an effect.

11. In general, crack formation is to be found less often in thinner coatings than in thicker coatings, which can again be attributed to the lower internal stresses. However, the thinner coatings according to the invention are a feature of the invention both in the finished product and in the method.

12. Since, according to the invention, the flanks and tool faces remain coated, a lower build-up of heat occurs, which in turn has a positive effect on the dimensional stability of the bore.

13. The advantages of the invention become noticeable particularly in single-blade reamer cutting tips. In these cutting tips, the wear on the flank, on account of the relatively low cutting speed, is greater than the wear on the tool face. The higher the cutting speed, the thicker is the hard-material coating to be formed on the tool face.

14. It has been found that even less cutting-edge chipping occurs if the otherwise conventional ultrasonic cleaning is dispensed with.

A very good description of the PVD method which can be used here is to be found in the VDI journal, volume 127 (1985) No. 17, pp. 691 to 696.

DESCRIPTION OF THE DRAWINGS

The invention will now be described with reference to preferred exemplary embodiments. In the Figures:

FIG. 1 shows the micrograph of a conventional reversible tip coated by the CVD method, FIG. 2 shows the reversible tip according to FIG. 1 but on which the hard-material has been removed from the tool face, FIG. 3 shows the micrograph of a cutting tip according to the invention, FIG. 4 shows a backscatter pattern for the cutting edge in FIG. 3 viewed from the tool face.

DETAILED DESCRIPTION

Figure 5:
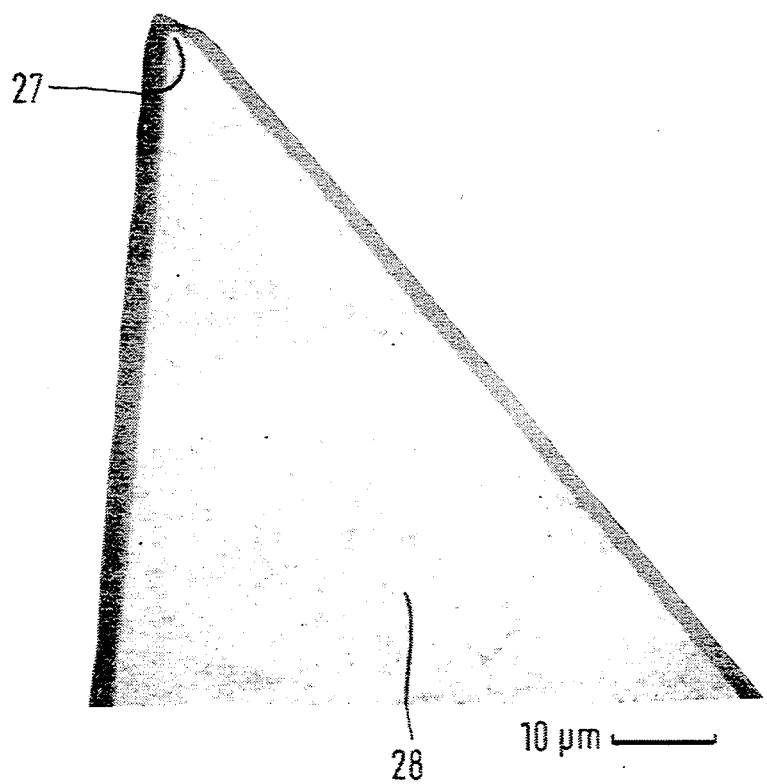
FIG. 5 shows the micrograph of a carbide blade, coated according to the invention, a 10 $\mu$m scale indicating the dimensions in all FIGS. 1 to 5.

The cutting area of a carbide cutting tip having a rake angle of 6° can be recognized in FIG. 1. The cutting tip 11 has a tool face 12, a flank 13 and a cutting edge 14. Located on the cutting tip 11 is a hard-material coating 16 which consists of TiN and has a uniform coating thickness, revealed by the scale. The hard-material coating at this location has a radius 17 which is considerably greater than 5 $\mu$m. According to FIG. 2, the hard-material coating 16 has been ground off. Since, for technical reasons relating to grinding, it is not possible to grind exactly in continuation of the tool face 12, there is not only no cutting edge 14 here. On the contrary the radius 18 has become even larger than the radius 17, as can be gathered from the scale micrograph.

According to FIG. 3, a carbide cutting tip 19 which has a rake angle of 15° is provided according to the invention. A hard-material coating 21 about 3.5 $\mu$m thick is applied to its tool face 12 by the PVD method. The cutting edge 14 is completely retained. A hard-material coating 22 which is 2.6 $\mu$m thick is applied to the flank 13. Both hard-material coatings 21, 22 consist of TiCN. Their surfaces 23, 24 are very flat, which FIG. 3 does not show particularly well but is revealed in FIG. 4. The surfaces 23, 24 do not meet at such an acute angle as would be assumed from the tool face 12 and the flank 13 located thereunder. On the contrary, a bevel 26 can be recognized which runs in a very shallow curve from about 2 o'clock to 8 o'clock and is tangent to the cutting edge 14 so that the cutting edge 14 according to FIG. 4 is partly exposed.

If the cutting tip 19 is used as a reversible tip for single-edged reamers for the fine machining of bores, the hard-material coating 22 is made thicker than the hard-material coating 21. In the exemplary embodiment, the cutting tip 19 is treated for the same time in a PVD installation. Only the flank 13 lay more in the vaporization shadow than the tool face 12, so that the hard-material coating 21 became thicker than the hard-material coating 22. If provision is made for the tool face 12 to lie in the vaporization shadow, the hard-material coating 22 becomes thicker than the hard-material coating 21. In the exemplary embodiment according to FIG. 5, the cutting edge 27 of a carbide blade 28 is likewise retained. The hard-material coating looking to the left is clearly thicker than the hard-material coating looking up to the right, which is likewise due to the shadowing relationships. Here, no pronounced bevel forms—probably since the carbide blade 28 is substantially more acute than 15°. But it can be recognized that here, too, there is a drawn-in portion from the thicker to the thinner coating so that the cutting edge 27 is only covered very thinly with TiCN material. Here—as FIG. 5 shows—the thicker coating forms n upwardly directed nose whose radius is essentially the same as the radius of the cutting edge 27.

When the method is performed, the workpiece holder shown in the VDI journal, volume 127 (1985) No. 17, page 691, FIG. 1 is made rotatable about its perpendicular axis. In addition, planetary drives are provided on the workpiece holder which rotate again about themselves like a funfair carousel whose cars rotate again by themselves several times during the overall rotation. The cutting tip is magnetically clamped in position on the platform belonging to each planetary gear so that its tool face 12 and flank 13 are parallel to the rotational axis. The leading surface then catches more TiCN from the plasma than the trailing surface, in the exemplary embodiment in FIG. 3 the flank 13.

Cutting tips coated with TiCN have proved to be better than cutting tips coated with TiN.

Figure 6:
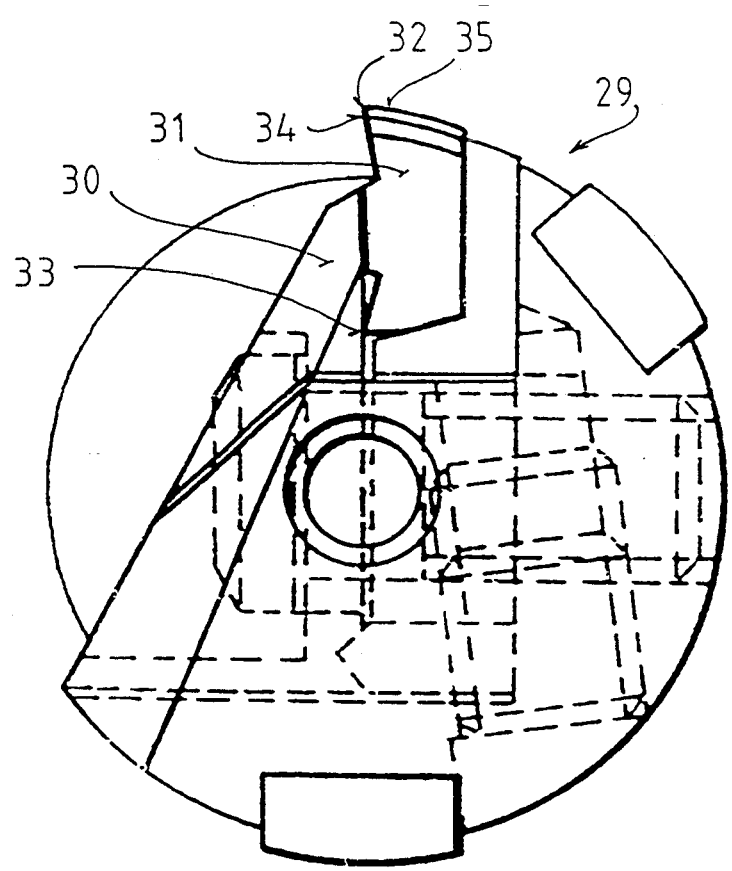
FIG. 6 shows a reamer having a reversable cutting blade, which is known in the art.

FIG. 6 shows a front view of the head 29 of a single-blade reamer with a reversable cutting tip, which is a well known representative of a tool for fine machining of bores. One example of such reamer is described in U.S. Pat. No. 4,353,669. The head 29 includes means 30 for clamping and fastening a cutting tip 31 thereon. The cutting tip 31, which is treated according to the example of FIG. 3, has two cutting edges 32, 33 on opposing sides for alternative use. For example, when cutting edge 32 is used, the tool face 34 and the flank 35 are used.

I claim:

1. A method of producing a carbide cutting tip having a flank, a tool face, a cutting edge provided at the transition between said flank and said tool face, and a than, hard material coating which contains titanium and nitrogen, and which is deposited on said flank, said tool face and in the area of said cutting edge, comprising:
  treating said cutting tip in a PVD installation,
  depositing a hard coating of material containing titanium and nitrogen by the PVD method on said carbide cutting tip,
  depositing a substantially thinner coating of said hard material at the transition between said flank and said tool face than on the adjoining flank and tool face, and
  retaining said substantially thinner hard material coating at the transition between said flank and said tool face without subsequent removal.

2. Method as claimed in claim 1, comprising treating said cutting tip for a duration appropriate to provide a coating thickness of less than 4 μm.

3. Method as claimed in claim 1, including chemically cleaning the surface of the cutting tip several times.

4. Method as claimed in claim 1, including cleaning the surface of the cutting tip without contacting said tip with ultrasonic waves.

5. In a carbide cutting tip, having
  a flank,
  a tool face,
  a cutting edge provided at the transition between the flank and the tool face, and
  a thin hard material coating that contains titanium and nitrogen deposited on the flank, the tool face and in an area of the cutting edge,
  the improvement wherein:
    a) the hard material coating that contains titanium and nitrogen is deposited by the PVD method,
    b) a substantially thinner coating of hard-material is deposited at the transition between the flank and the tool face in the area of the cutting edge than on the adjoining flank and tool face, and
    c) the hard material coating is not subsequently removed.

6. The cutting tip as claimed in claim 5, comprising carbide having a K-quality according to ISO classification.

7. The cutting tip as claimed in claim 6, comprising carbide having a K05 to K20 quality.

8. The cutting tip as claimed in claim 7, comprising carbide having a K10 quality.

9. The cutting tip as claimed in claim 5, wherein at least one of the flank and the tool face has a surface quality of Rz smaller than 0.5.

10. The cutting tip as claimed in claim 9, wherein at least one of the flank and the tool face has a surface quality no greater than 0.3.

11. The cutting tip as claimed in claim 10, wherein at least one of the flank and the tool face has a surface quality no greater than 0.1.

12. The cutting tip as claimed in claim 5, wherein the cutting tip comprises means for fine machining of bores.

13. The cutting tip as claimed in claim 5, wherein the cutting tip comprises the cutting edge of a single-blade reamer.

14. The cutting tip as claimed in claim 5, wherein the hard material coating on the tool face is thinner than on the flank.

15. The cutting tip as claimed in claim 5, wherein the hard material coating on the flank is thinner than 4 μm.

16. The cutting tip as claimed in claim 15, wherein the hard material coating is thinner than 3 μm.

17. The cutting tip as claimed in claim 16, wherein the hard material coating is between 2.5 and 1.5 μm.

18. The cutting tip as claimed in claim 5, wherein the hard material coating on the tool face is thinner than 4 μm.

19. The cutting tip as claimed in claim 18, wherein the hard material coating is thinner than 3 μm.

20. The cutting tip as claimed in claim 19, wherein the hard material coating is between 1.5 and 2.5 μm.

21. The cutting tip as claimed in claim 5, wherein the surface of the hard material coating at the transition of the flank and the tool face is roughly in the configuration of a bevel.

22. The cutting tip as claimed in claim 21, wherein the bevel is roughly perpendicular to an angle bisector of the flank and the tool face.

23. The device according to claim 13, wherein the single blade is reversible and includes two cutting edges.

* * * * *